(12) United States Patent
Xie

(10) Patent No.: US 10,114,259 B2
(45) Date of Patent: Oct. 30, 2018

(54) ARRAY SUBSTRATE, LIQUID CRYSTAL DISPLAY PANEL AND MANUFACTURING METHOD

(71) Applicant: Wuhan China Star Optoelectronics Technology Co., Ltd., Wuhan, Hubei (CN)

(72) Inventor: Yingtao Xie, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 142 days.

(21) Appl. No.: 15/322,253

(22) PCT Filed: Nov. 4, 2016

(86) PCT No.: PCT/CN2016/104606
§ 371 (c)(1),
(2) Date: Dec. 27, 2016

(87) PCT Pub. No.: WO2018/035973
PCT Pub. Date: Mar. 1, 2018

(65) Prior Publication Data
US 2018/0217458 A1    Aug. 2, 2018

(30) Foreign Application Priority Data

Aug. 26, 2016 (CN) .......................... 2016 1 07426771

(51) Int. Cl.
G02F 1/136 (2006.01)
G02F 1/1362 (2006.01)
(Continued)

(52) U.S. Cl.
CPC ...... *G02F 1/136209* (2013.01); *G02F 1/1368* (2013.01); *G02F 1/13439* (2013.01);
(Continued)

(58) Field of Classification Search
CPC ......... G02F 1/136209; G02F 1/134363; G02F 1/13439; G02F 1/136286; G02F 1/1368;
(Continued)

(56) References Cited

U.S. PATENT DOCUMENTS 6,245,602 B1 * 6/2001 Ho ................... H01L 29/66757
257/E21.413
6,888,161 B2 * 5/2005 Shih ................... G02F 1/136209
257/347
(Continued)

FOREIGN PATENT DOCUMENTS

| CN | 202796954 U | 3/2013 |
|---|---|---|
| CN | 203950283 U | 11/2014 |

(Continued)

*Primary Examiner* — Hoan C Nguyen
(74) *Attorney, Agent, or Firm* — Andrew C. Cheng

(57) ABSTRACT

The disclosure discloses an array substrate, a liquid crystal display panel and a manufacturing method, the array substrate includes designing a data line layer and a light shield layer on a same layer, moreover, a source electrode layer, a drain electrode layer, an oxide semiconductor layer and a common electrode layer are designed on a same layer, the source electrode layer, the drain electrode layer and the common electrode layer are formed by doping the oxide semiconductor material, the source electrode layer, the drain electrode layer and the common electrode layer can be conductive by increasing conductivity thereof. By the method above, the disclosure can reduce the amount of masks in processes and costs in production significantly.

10 Claims, 5 Drawing Sheets

(51) Int. Cl.
*H01L 27/12* (2006.01)
*H01L 29/786* (2006.01)
*G02F 1/1368* (2006.01)
*G02F 1/1343* (2006.01)

(52) U.S. Cl.
CPC .. *G02F 1/134363* (2013.01); *G02F 1/136286* (2013.01); *H01L 27/124* (2013.01); *H01L 27/127* (2013.01); *H01L 27/1225* (2013.01); *H01L 27/1288* (2013.01); *H01L 29/7869* (2013.01); *H01L 29/78633* (2013.01); *G02F 1/136227* (2013.01); *G02F 2001/13685* (2013.01); *G02F 2001/134318* (2013.01); *G02F 2001/136231* (2013.01); *G02F 2001/136295* (2013.01); *G02F 2202/06* (2013.01); *G02F 2202/10* (2013.01)

(58) Field of Classification Search
CPC ... G02F 1/136227; G02F 2001/134318; G02F 2001/136231; G02F 2001/134295; G02F 2001/13685; G02F 2202/06; G02F 2202/10; H01L 127/124; H01L 27/127; H01L 27/1228

USPC .......................................................... 349/47
See application file for complete search history.

(56) References Cited

U.S. PATENT DOCUMENTS

| 8,455,876 | B2 | 6/2013 | Choi et al. |
| 2004/0183130 | A1* | 9/2004 | Hara .................. H01L 29/4908 257/331 |
| 2011/0049523 | A1 | 3/2011 | Choi et al. |
| 2016/0027817 | A1 | 1/2016 | Yoo et al. |
| 2016/0141425 | A1* | 5/2016 | Sun ..................... H01L 27/124 257/72 |

FOREIGN PATENT DOCUMENTS

| CN | 104393000 A | | 3/2015 |
| CN | 105097948 A | | 11/2015 |
| CN | 105720012 A | | 6/2016 |
| JP | 2009194348 A | * | 8/2009 |
| KR | 20140017854 A | | 2/2014 |

* cited by examiner

ARRAY SUBSTRATE, LIQUID CRYSTAL DISPLAY PANEL AND MANUFACTURING METHOD

TECHNICAL FIELD

The disclosure relates to a liquid crystal display technical field, and more particularly to an array substrate, a liquid crystal display panel and a manufacturing method.

DESCRIPTION OF RELATED ART

An oxide semiconductor TFT is becoming a serious competitor in a next generation of display technique due to advantages such as high mobility and mass production.

However, the oxide semiconductor TFT is sensitive to light, an additional light shield layer is required to reduce influence of light on stability of a device. In the prior art, during manufacturing an oxide semiconductor TFT liquid crystal display panel, an extra masking step is required to add the light shield layer, therefore, 8 masking processes are generally required for the entire device.

The manufacturing process above is pricy and complex due to the additional amount of masks.

SUMMARY

The disclosure provides an array substrate, a liquid crystal display panel and a manufacturing method, which can reduce 3 masks and costs in production.

To solve the technical problem above, the disclosure provides an array substrate, including a substrate, a data line layer and a light shield layer disposed on a same layer and formed on the substrate separately, material of the light shield layer and material of the data line layer are both metallic material, a first insulating layer covering the substrate, the data line layer and the light shield layer, a source electrode layer, a drain electrode layer, an oxide semiconductor layer and a common electrode layer formed on the first insulating layer separately, the source electrode layer and the drain electrode layer are adjacent to two sides of the oxide semiconductor layer respectively, the common electrode layer and the drain electrode layer are disposed separately, the source electrode layer, the drain electrode layer and the common electrode layer are formed by processing oxide semiconductor material by doping treatment, the oxide semiconductor layer is capable of preventing influence of light completely subjected to shelter of the light shield layer, a second insulating layer covering the oxide semiconductor layer, a gate electrode layer formed on the second insulating layer, material thereof is metallic material, an insulated interlayer deposition covering the first insulating layer, the source electrode layer, the gate electrode layer, the drain electrode layer and the common electrode layer, the interlayer deposition is formed with a first contact hole, a second contact hole and a third contact hole throughout the interlayer deposition respectively, one end of the first contact hole extends to and penetrates the first insulating layer to connect with the data line layer, one end of the second contact hole and the source electrode layer are connected, one end of the third contact hole and the drain electrode layer are connected, material filled in the first contact hole, the second contact hole and the third contact hole is transparent electrode material, a transparent electrode layer and a pixel electrode layer formed on the interlayer deposition separately, material thereof is transparent electrode material, the transparent electrode layer is connected with the other end of the first contact hole and the other end of the second contact hole respectively, so that the source electrode layer is connected with the data line layer through the second contact hole, the transparent electrode layer and the first contact hole electrically, the pixel electrode layer and the other end of the third contact hole are connected to achieve electrical connection of the pixel electrode layer and the drain electrode layer.

The common electrode layer is divided into a plurality of parts.

The common electrode layer is integrated.

The doping treatment is $H_2$, Ar or $NH_3$ plasma treatment.

To solve the technical problem above, the disclosure further provides a liquid crystal display panel, including a first substrate, a second substrate disposed opposite to the first substrate, which includes a substrate, a data line layer and a light shield layer disposed on a same layer and formed on the substrate separately, material of the light shield layer and material of the data line layer are metallic material, a first insulating layer covering the substrate, the data line layer and the light shield layer, a source electrode layer, a drain electrode layer, an oxide semiconductor layer and a common electrode layer formed on the first insulating layer separately, the source electrode layer and the drain electrode layer are adjacent to two sides of the oxide semiconductor layer respectively, the common electrode layer and the drain electrode layer are disposed separately, the source electrode layer, the drain electrode layer and the common electrode layer are formed by processing oxide semiconductor material by doping treatment, the oxide semiconductor layer is capable of preventing influence of light completely subjected to shelter of the light shield layer, a second insulating layer covering the oxide semiconductor layer, a gate electrode layer formed on the second insulating layer, material thereof is metallic material, an insulated interlayer deposition covering the first insulating layer, the source electrode layer, the gate electrode layer, the drain electrode layer and the common electrode layer, the interlayer deposition is formed with a first contact hole, a second contact hole and a third contact hole throughout the interlayer deposition respectively, one end of the first contact hole extends to and penetrates the first insulating layer to connect with the data line layer, one end of the second contact hole and the source electrode layer are connected, one end of the third contact hole and the drain electrode layer are connected, material filled in the first contact hole, the second contact hole and the third contact hole is transparent electrode material, a transparent electrode layer and a pixel electrode layer formed on the interlayer deposition separately, material thereof is transparent electrode material, the transparent electrode layer is connected with the other end of the first contact hole and the other end of the second contact hole, so that the source electrode layer is connected with the data line layer electrically through the second contact hole, the transparent electrode layer and the first contact hole, the pixel electrode layer and the other end of the third contact hole are connected to achieve electrical connection of the pixel electrode layer and the drain electrode layer, a liquid crystal layer disposed between the first substrate and the second substrate.

The common electrode layer is divided into a plurality of parts.

The common electrode layer is integrated.

The doping treatment is $H_2$, Ar or $NH_3$ plasma treatment.

To solve the technical problem above, the disclosure further provides a manufacturing method of an array substrate, including exposing and developing metallic material deposited on a substrate by a first mask at a time, respectively obtaining a data line pattern and a light shield layer pattern separately disposed on a same layer, forming a first insulating layer and an oxide semiconductor layer on the data line pattern and the light shield layer pattern in sequence, exposing and developing the oxide semiconductor layer deposited on the first insulating layer by a second mask at a time, obtaining a source electrode pattern, a drain electrode pattern, an oxide semiconductor layer pattern and a common electrode pattern respectively, the oxide semiconductor layer pattern is capable of preventing influence of light completely subjected to shelter of the light shield layer pattern, forming a second insulating layer and a gate electrode layer on the source electrode pattern, the drain electrode pattern, the oxide semiconductor layer pattern and the common electrode pattern in sequence, exposing and developing the second insulating layer by a third mask at a time, obtaining a second insulating layer pattern and a gate electrode pattern respectively, the second insulating layer pattern and the gate electrode pattern are disposed on the oxide semiconductor layer pattern, processing the source electrode pattern, the drain electrode pattern and the common electrode pattern without protection of the second insulating layer pattern and the gate electrode pattern by doping treatment, converting material of the source electrode pattern, the drain electrode pattern and the common electrode pattern from the oxide semiconductor material to conductive material, the source electrode pattern and the drain electrode pattern are disposed adjacently to two sides of the oxide semiconductor layer pattern respectively, the common electrode pattern and the drain electrode pattern are disposed separately, forming an insulated interlayer deposition on the first insulating layer pattern, the source electrode pattern, the gate electrode pattern, the drain electrode pattern and the common electrode pattern, exposing and developing the interlayer deposition by a fourth mask at a time, forming a first contact hole, a second contact hole and a third contact hole throughout the interlayer deposition respectively, one end of the first contact hole extends to and penetrates the first insulating layer pattern to connect with the data line pattern, one end of the second contact hole and the source electrode pattern are connected, one end of the third contact hole and the drain electrode pattern are connected, forming a transparent electrode layer on the interlayer deposition, fully filling the transparent electrode material in the first contact hole, the second contact hole and the third contact hole, exposing and developing the transparent electrode layer by a fifth mask at a time, obtaining a transparent electrode layer pattern and a pixel electrode pattern respectively, the transparent electrode layer pattern is connected with the other end of the first contact hole and the other end of the second contact hole respectively, making the source electrode pattern to connect with the data line pattern electrically through the second contact hole, the transparent electrode layer pattern and the first contact hole, the pixel electrode pattern and the other end of the third contact hole are connected, to achieve electrical connection of the pixel electrode pattern and the drain electrode pattern.

The common electrode pattern is divided into a plurality of parts. Or the common electrode pattern is integrated.

The doping treatment is $H_2$, Ar or $NH_3$ plasma treatment.

Beneficial effects of the disclosure are distinguishing from the prior art, the data line layer and the light shield layer are designed on a same layer according to the disclosure, moreover, the source electrode, the drain electrode, the oxide semiconductor layer and the common electrode layer are designed on a same layer, the source electrode layer, the drain electrode layer and the common electrode layer are formed by doping the oxide semiconductor material, material of the source electrode layer, the drain electrode layer and the common electrode layer can be conductive by increasing conductivity thereof, which can reduce three masking processes compared with the prior art, only 5 masks are required, which can reduce the amount of masks in the process significantly and costs in production.

DETAILED DESCRIPTION OF PREFERRED EMBODIMENTS

Embodiments of the disclosure will be described in detail with reference to the accompanying drawings as follows.

Figure 1:
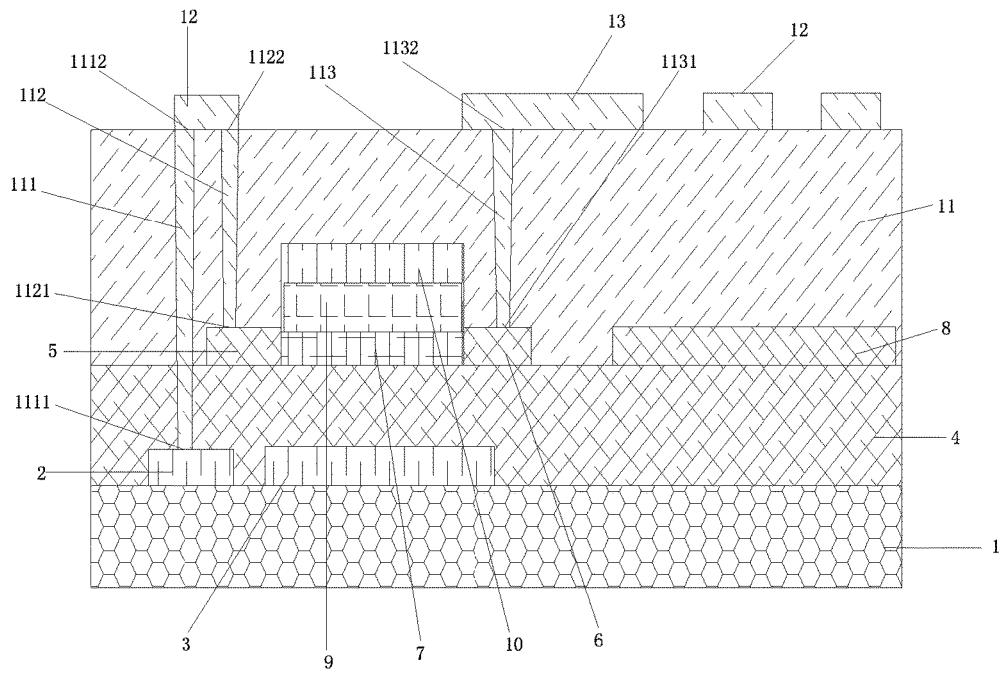
FIG. 1 is a structural schematic view of an array substrate according to an embodiment of the disclosure.
Figure 2:
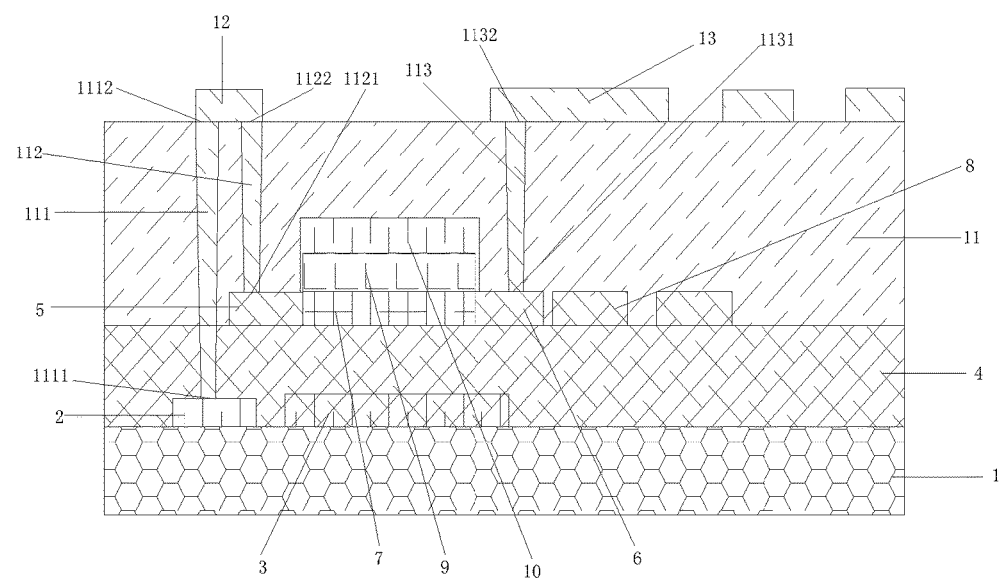
FIG. 2 is a structural schematic view of an array substrate according to another embodiment of the disclosure.

Referring to FIG. 1 and FIG. 2, FIG. 1 and FIG. 2 are structural schematic views of array substrates according to two embodiments of the disclosure, the array substrate includes a substrate 1, a data line layer 2, a light shield layer 3, a first insulating layer 4, a source electrode layer 5, a drain electrode layer 6, an oxide semiconductor layer 7, a common electrode layer 8, a second insulating layer 9, a gate electrode layer 10, an interlayer deposition 11, a transparent electrode layer 12 and a pixel electrode layer 13.

The data line layer 2 and the light shield layer 3 are in a same layer, which are formed on the substrate 1 separately, material of the light shield layer 3 and that of the data line layer 2 are both metallic material. In other words, a difference compared with the prior art is that the data line layer 2 and the light shield layer 3 are designed in the same layer in the disclosure, which can reduce a masking process compared with the prior art.

The first insulating layer 4 covers the substrate 1, the data line layer 2 and the light shield layer 3. Material of the first insulating layer as a buffer layer is insulating material, for instance, it can be a SiOx thin film.

The source electrode layer 5, the drain electrode layer 6, the oxide semiconductor layer 7 and the common electrode layer 8 are formed on the first insulating layer 4 respectively, the source electrode layer 5 and the drain electrode layer 6 are adjacent to two sides of the oxide semiconductor layer 7 respectively, the common electrode layer 8 and the drain electrode layer 6 are disposed separately, the source electrode layer 5, the drain electrode layer 6 and the common electrode layer 8 are formed by doping oxide semiconductor material, the oxide semiconductor layer 7 can completely avoid influence of light subjected to the light shield layer 3. In other words, the source electrode layer 5, the drain electrode layer 6, the oxide semiconductor layer 7 and the common electrode layer 8 are designed in one layer, as material of the source electrode layer 5, the drain electrode layer 6, the common electrode layer 8 must be conductive, in the application, the source electrode layer 5, the drain electrode layer 6 and the common electrode layer 8 are formed by doping the oxide semiconductor material. Material of the source electrode layer 5, the drain electrode layer 6 and the common electrode layer 8 can be conductive by converting the oxide semiconductor material to conductive material with oxide dopant by doping that can increase conductivity thereof, which can reduce two masking processes compared with the prior art. In an embodiment, a fundamental principle of converting the oxide semiconductor material to the conductive material by doping treatment can be taking oxygen atoms in the oxide semiconductor material out, making the oxygen atoms to react with other objects, so as to convert the oxide semiconductor material to the conductive material due to the oxygen atoms loss. The doping treatment includes but not limits in plasma, UV radiation, metal oxidation, etc. Obviously, if material of the interlayer deposition 11 is SiNx, during depositing the interlayer deposition 11, as hydrogen $H_2$ is released, $H_2$ can seize the oxygen atoms in the oxide semiconductor material to react, which can convert the oxide semiconductor material to the conductive material.

The second insulating layer 9 covers the oxide semiconductor layer 7. Material of the insulating layer is insulating material, for instance, which can be a SiOx thin film.

The gate electrode layer 10 is formed on the second insulating layer 9, material of which is metallic material.

The insulated interlayer deposition 11 covers the first insulating layer 4, the source electrode layer 5, the gate electrode layer 10, the drain electrode layer 6 and the common electrode layer 8. A first contact hole 111, a second contact hole 112 and a third contact hole 113 throughout the interlayer deposition 11 are formed in the interlayer deposition 11 respectively, one end 1111 of the first contact hole 111 extends to and goes through the first insulating layer 4 to connect with the data line layer 2, one end 1121 of the second contact hole 112 and the source electrode layer 5 are connected, one end 1131 of the third contact hole 113 and the drain electrode layer 6 are connected, material filled in the first contact hole 111, the second contact hole 112 and the third contact hole 113 is transparent electrode material.

The transparent electrode layer 12 and the pixel electrode layer 13 are formed on the interlayer deposition 11 separately, material of which is transparent electrode material, the transparent electrode layer 12 is connected with the other end 1112 of the first contact hole 111 and the other end 1122 of the second contact hole 112 respectively, so that the source electrode layer 5 is connected to the data line layer 2 electrically through the second contact hole 112, the transparent electrode layer 12 and the first contact hole 111, the pixel electrode layer 13 and the other end 1132 of the third contact hole 113 are connected, so as to connect the pixel electrode layer 13 and the drain electrode layer 6 electrically.

As the data line layer 2 and the light shield layer 3 are designed on a same layer according to the embodiment of the disclosure, moreover, the source electrode layer 5, the drain electrode layer 6, the oxide semiconductor layer 7 and the common electrode layer 8 are designed on a same layer, the source electrode layer 5, the drain electrode layer 6 and the common electrode layer 8 are formed by doping the oxide semiconductor material, material of the source electrode layer 5, the drain electrode layer 6 and the common electrode layer 8 can be conductive by increasing conductivity thereof, which can reduce three masking processes compared with the prior art, only 5 masking processes are required, which can reduce the amount of the masks in the process as well as costs in production significantly.

An embodiment has multiple common electrode layers 8, as shown in FIG. 2.

In another embodiment, the common electrode layer 8 is integrated, as shown in FIG. 1.

Figure 3:
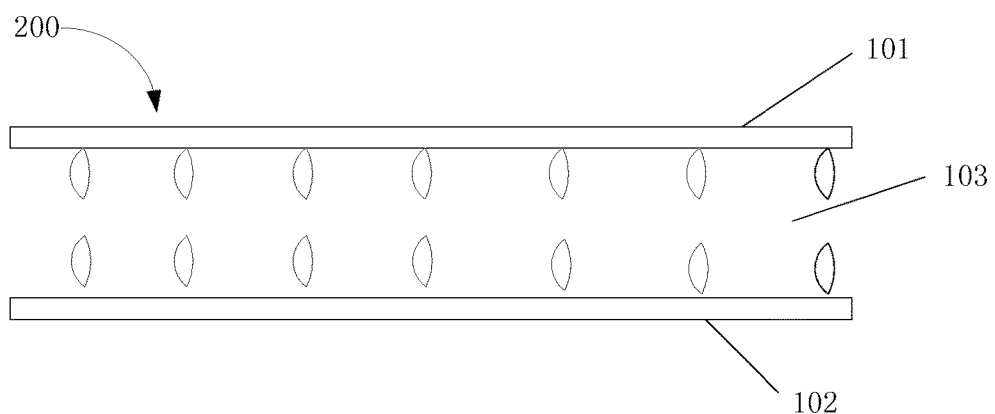
FIG. 3 is a structural schematic view of a liquid crystal display panel according to an embodiment of the disclosure.

Referring to FIG. 3, FIG. 3 is a structural schematic view of a liquid crystal display panel according to an embodiment of the disclosure, a liquid crystal display panel 200 includes a first substrate 101, a second substrate 102 disposed opposite to the first substrate 101 and a liquid crystal layer 103 disposed between the first substrate 101 and the second substrate 102, the second substrate 102 is any of the substrates mentioned above, a detailed illustration of relative content can be referred to the array substrate above, which will not be repeated.

Figure 4:
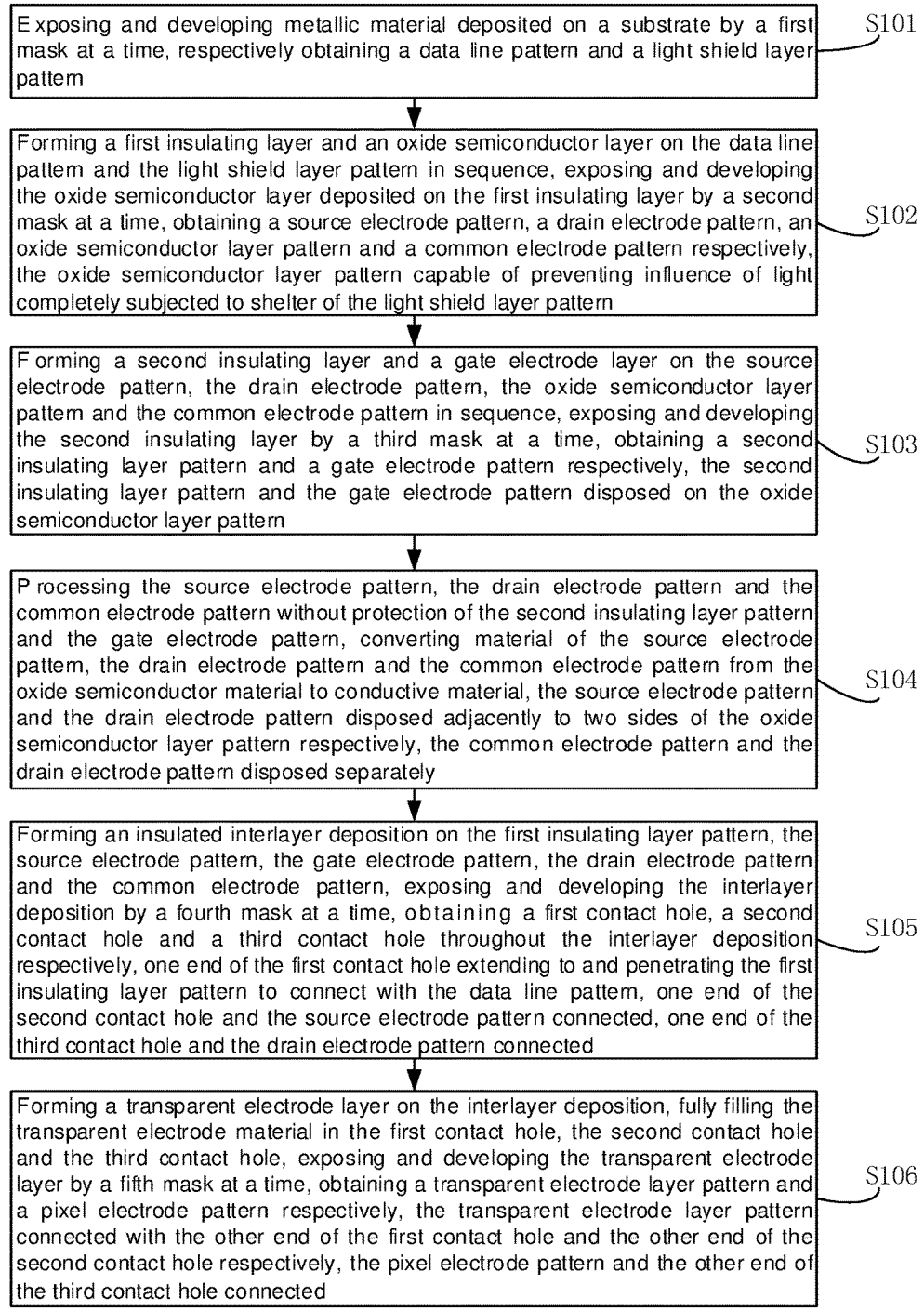
FIG. 4 is a flow chart of a manufacturing method of an array substrate according to an embodiment of the disclosure.

Referring to FIG. 4, the disclosure further provides a manufacturing method of an array substrate, the method includes step S101: exposing and developing metallic material deposited on a substrate by a first mask at a time, respectively obtaining a data line pattern and a light shield layer pattern separated on a same layer.

Figure 5:
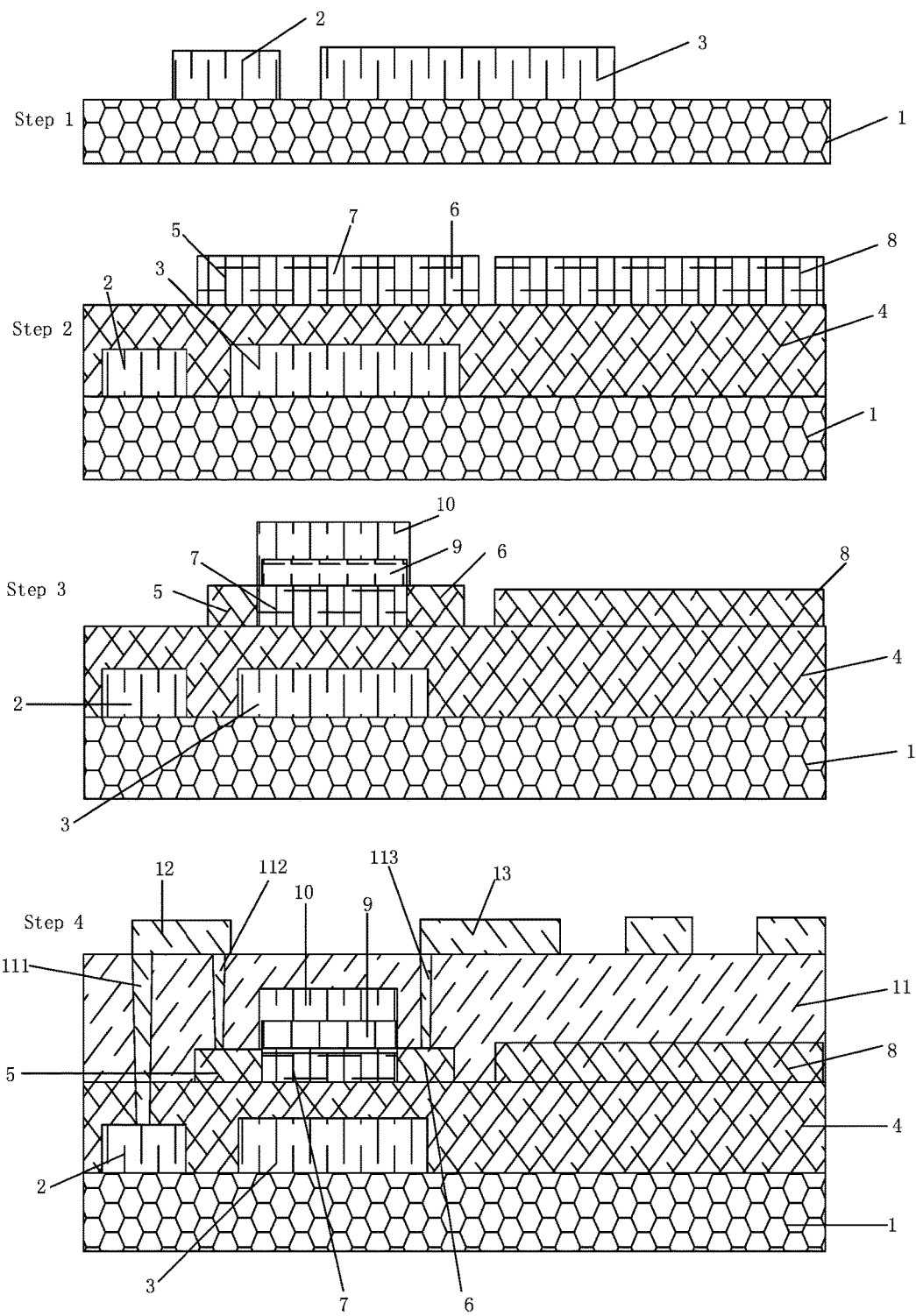
FIG. 5 is a schematic view of a process of a manufacturing method of an array substrate according to the disclosure.
Figure 6:
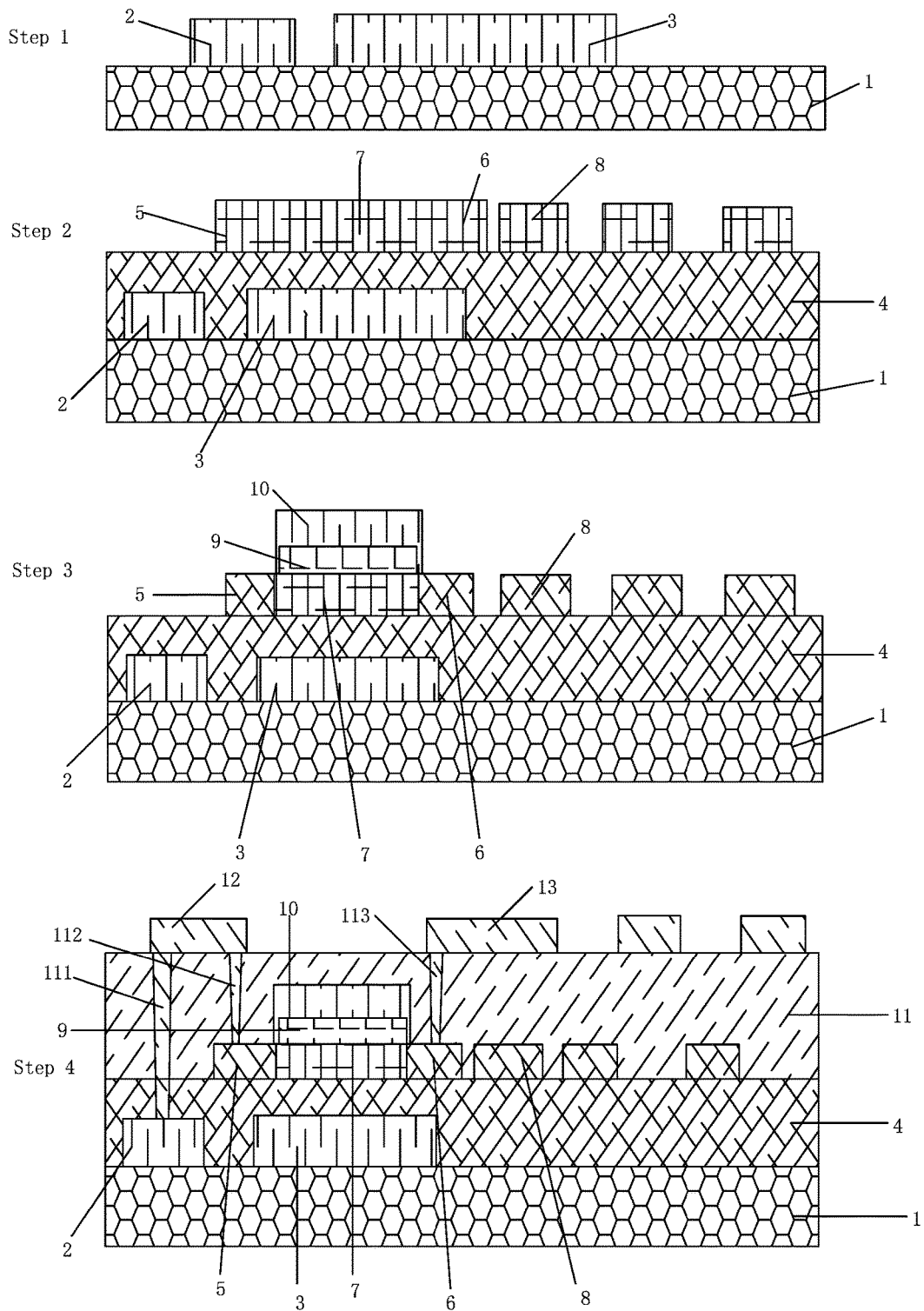
FIG. 6 is a schematic view of another process of a manufacturing method of an array substrate according to the disclosure.

Referring to FIG. 5 and FIG. 6, FIG. 5 is a schematic view of a process of a manufacturing method of an array substrate according to the disclosure, FIG. 6 is a schematic view of another process of a manufacturing method of an array substrate according to the disclosure. Step 1, depositing a layer of metallic material on the substrate 1, utilizing the first mask to construct the data line pattern 2 and the light shield layer pattern 3 by a standard photoetching.

In an embodiment, metallic material is deposited on the substrate by physical vapor deposition (PVD).

The data line pattern and the light shield layer pattern are designed on a same layer, which can reduce a masking process compared with the prior art.

Step S102: forming a first insulating layer and an oxide semiconductor layer on the data line pattern and the light shield layer pattern in sequence, exposing and developing the oxide semiconductor material layer deposited on the first insulating layer by a second mask at a time to obtain a source electrode pattern, a drain electrode pattern, an oxide semiconductor layer pattern and a common electrode pattern respectively, the oxide semiconductor layer pattern sheltered by the light shield layer pattern can prevent the influence of light completely.

The first insulating layer covers the substrate, the data line pattern and the light shield layer pattern, material of the first insulating layer as a buffer layer is insulating material, for instance, it can be a SiOx thin film. In an embodiment, the step can be processed by chemical vapor deposition (CVD).

The first insulating layer is covered by a layer of oxide semiconductor material, the required source electrode pattern, drain electrode pattern, oxide semiconductor layer pattern and common electrode pattern can be formed utilizing the second mask by the standard photoetching process. Obviously, after the step, material of the source electrode pattern, the drain electrode pattern and the common electrode pattern is still the oxide semiconductor material. A doping treatment in the following step is required to convert to conductive material. In an embodiment, the layer of oxide semiconductor material can be deposited by a method of PVD, then annealed in air, the required patterns above are formed by the standard photoetching process.

Referring to FIG. 5 and FIG. 6, in step 2, the first insulating layer 4 and the oxide semiconductor layer are formed on the data line pattern 2 and the light shield layer pattern 3 in sequence, the oxide semiconductor layer deposited on the first insulating layer 4 is exposed and developed by the second mask at a time to obtain the source electrode pattern 5, the drain electrode pattern 6, the oxide semiconductor layer pattern 7 and the common electrode pattern 8 respectively.

The oxide semiconductor layer pattern is directly above the light shield layer pattern, the oxide semiconductor layer pattern can prevent influence of light completely subjected to the light shield layer pattern.

Step S103: forming a second insulating layer and a gate electrode layer on the source electrode pattern, the drain electrode pattern, the oxide semiconductor layer pattern and the common electrode pattern in sequence, exposing and developing the second insulating layer and the gate electrode layer by a third mask at a time to obtain a second insulating layer pattern and a gate electrode pattern respectively, the second insulating layer pattern and the gate electrode pattern are on the oxide semiconductor layer pattern.

The second insulating layer covers the source electrode pattern, the drain electrode pattern, the oxide semiconductor layer pattern and the common electrode pattern, material of which is insulating material, for instance, it can be a SiOx thin film. In an embodiment, the step can be processed by a method of CVD.

Another layer of metallic material is deposited on the second insulating layer as a gate electrode layer, for instance, the method of PVD can be adopted to deposit, the second insulating layer and the gate electrode layer are exposed and developed by the third mask at a time, gate metal and the second insulating below without protection of photoetching adhesive are etched by a method such as dry etching or wet etching to obtain the second insulating layer pattern and the gate electrode pattern, the second insulating layer pattern and the gate electrode pattern are on the oxide semiconductor layer pattern.

Step S104: doping the source electrode pattern, the drain electrode pattern and the common electrode pattern without protection of the second insulating layer pattern and the gate electrode pattern, for converting material of the source electrode pattern, the drain electrode pattern and the common electrode pattern from the oxide semiconductor material to conductive material, the source electrode pattern and the drain electrode pattern are adjacent to two sides of the oxide semiconductor layer pattern respectively, the common electrode pattern and the drain electrode pattern are disposed separately. In an embodiment, a fundamental principle of converting the oxide semiconductor material to the conductive material by doping treatment can be taking oxygen atoms in the oxide semiconductor material out, making the oxygen atoms to react with other objects, so as to convert the oxide semiconductor material to the conductive material due to the oxygen atoms loss. The doping treatment includes but not limits in plasma, UV radiation, metal oxidation, etc. Obviously, if material of the interlayer deposition 11 is SiNx, during depositing the interlayer deposition 11, as hydrogen $H_2$ is released, $H_2$ can seize the oxygen atoms in the oxide semiconductor material to react, which can convert the oxide semiconductor material to the conductive material. In other words, the source electrode pattern, the drain electrode pattern and the common electrode pattern without protection of the second insulating layer pattern and the gate electrode pattern are doped while the interlayer deposition 11 is deposited, then step S104 can be ignored and directly go to step S105.

The second insulating layer pattern and the gate electrode pattern are on the oxide semiconductor layer pattern, which can protect the oxide semiconductor layer pattern, the unprotected source electrode pattern 5, the drain electrode pattern 6 and the common electrode pattern 8 are exposed, material of which is still the oxide semiconductor material, the unprotected oxide semiconductor material is doped, for instance, $H_2$, Ar or $NH_3$ plasma treatment increases conductivity thereof to form a source drain electrode and the common electrode.

Referring to FIG. 5 and FIG. 6, in step 3, material of the second insulating layer 9 and material of the gate electrode layer 10 are deposited respectively, the grooved oxide semiconductor layer pattern 7 is formed utilizing the third mask by self-aligned technology, the source electrode 5, the drain electrode 6 and the common electrode 8 are formed by plasma treatment.

Step S105: forming an insulated interlayer deposition on the first insulating layer pattern, the source electrode pattern, the gate electrode pattern, the drain electrode pattern and the common electrode pattern, exposing and developing the interlayer deposition by a fourth mask at a time, forming a first contact hole, a second contact hole and a third contact penetrating the interlayer deposition respectively, one end of the first contact hole extends to and penetrates the first insulating layer pattern to connect with the data line pattern, one end of the second contact hole and the source electrode pattern are connected, one end of the third contact hole and the drain electrode pattern are connected.

Insulated interlayer deposition (ILD) covers the first insulating pattern, the source electrode pattern, the gate electrode pattern, the drain electrode pattern and the common electrode pattern, material of which can be SiOx of SiNx or a combination of the two with any order. The interlayer deposition can adopt the CVD method to deposit. The interlayer deposition is defined with contact holes utilizing a fourth mask by the standard photoetching process to obtain the first contact hole, the second contact hole and the third contact hole throughout the interlayer deposition respectively, one end of the first contact hole extends to and penetrates the first insulating layer pattern to connect with the data line pattern, one end of the second contact hole and the source electrode pattern are connected, one end of the third contact hole and the drain electrode pattern are connected.

Step S106: forming a transparent electrode layer on the interlayer deposition, making transparent electrode material to be filled in the first contact hole, the second contact hole and the third contact hole, exposing and developing the transparent electrode material utilizing a fifth mask at a time to obtain the transparent electrode layer pattern and the pixel electrode pattern respectively, the transparent electrode layer pattern is connected with the other end of the first contact hole and the other end of the second contact hole respectively to connect the source electrode pattern and the data line pattern through the second contact hole, the transparent electrode layer pattern and the first contact hole electrically, the pixel electrode pattern and the other end of the third contact hole are connected to achieve electrical connection of the pixel electrode pattern and the drain electrode pattern.

The interlayer deposition is deposited with a layer of transparent electrode material, such as a layer of ITO film, the transparent electrode material also infiltrate and fills the first contact hole, the second contact hole and the third contact hole, the contact holes connect the data line and the source electrode, as well as the pixel electrode and the drain electrode, the transparent electrode layer pattern and the pixel electrode pattern are prepared by patterning of the standard photoetching process.

The common electrode pattern is divided into multiple parts, as shown in FIG. 6.

The common electrode pattern is integrated, as shown in FIG. 5.

Referring to FIG. 5 and FIG. 6, in step 4, three contact holes 111, 112 and 113 are defined in the deposited ILD 11 by the photoetching process, then the transparent electrode material is deposited and patterned to form the transparent electrode layer pattern 12 and the pixel electrode pattern 13.

The data line and the light shield layer are designed on a same layer according to the embodiment of the disclosure, moreover, the source electrode, the drain electrode, the oxide semiconductor material and the common electrode are designed on a same layer, the source electrode, the drain electrode and the common electrode are formed by doping the oxide semiconductor material, material of the source electrode, the drain electrode and the common electrode can be conductive by increasing conductivity thereof, which can reduce three masking processes compared with the prior art, only 5 masks are required, which can reduce the amount of masks in the process significantly and costs in production.

Above are merely embodiments rather than limitations of the disclosure, any equivalent structure or process according to the disclosure applied in other relative fields directly or indirectly should be covered by the protected scope of the disclosure.

What is claimed is:

1. A manufacturing method of an array substrate, wherein the method comprises:

exposing and developing metallic material deposited on a substrate by a first mask at a time, respectively obtaining a data line pattern and a light shield layer pattern separately disposed on a same layer;

forming a first insulating layer and an oxide semiconductor layer on the data line pattern and the light shield layer pattern in sequence, exposing and developing the oxide semiconductor layer deposited on the first insulating layer by a second mask at a time, obtaining a source electrode pattern, a drain electrode pattern, an oxide semiconductor layer pattern and a common electrode pattern respectively, wherein the oxide semiconductor layer pattern is capable of preventing influence of light completely subjected to shelter of the light shield layer pattern;

forming a second insulating layer and a gate electrode layer on the source electrode pattern, the drain electrode pattern, the oxide semiconductor layer pattern and the common electrode pattern in sequence, exposing and developing the second insulating layer by a third mask at a time, obtaining a second insulating layer pattern and a gate electrode pattern respectively, the second insulating layer pattern and the gate electrode pattern disposed on the oxide semiconductor layer pattern;

processing the source electrode pattern, the drain electrode pattern and the common electrode pattern without protection of the second insulating layer pattern and the gate electrode pattern by doping treatment, converting material of the source electrode pattern, the drain electrode pattern and the common electrode pattern from the oxide semiconductor material to conductive material, the source electrode pattern and the drain electrode pattern disposed adjacently to two sides of the oxide semiconductor layer pattern respectively, the common electrode pattern and the drain electrode pattern disposed separately;

forming an insulated interlayer deposition on the first insulating layer pattern, the source electrode pattern, the gate electrode pattern, the drain electrode pattern and the common electrode pattern, exposing and developing the interlayer deposition by a fourth mask at a time, forming a first contact hole, a second contact hole and a third contact hole throughout the interlayer deposition respectively, one end of the first contact hole extending to and penetrating the first insulating layer pattern to connect with the data line pattern, one end of the second contact hole and the source electrode pattern connected, one end of the third contact hole and the drain electrode pattern connected;

forming a transparent electrode layer on the interlayer deposition, fully filling the transparent electrode material in the first contact hole, the second contact hole and the third contact hole, exposing and developing the transparent electrode layer by a fifth mask at a time, obtaining a transparent electrode layer pattern and a pixel electrode pattern respectively, the transparent electrode layer pattern connected with the other end of the first contact hole and the other end of the second contact hole respectively, making the source electrode pattern to connect with the data line pattern electrically through the second contact hole, the transparent electrode layer pattern and the first contact hole, the pixel electrode pattern and the other end of the third contact hole connected, to achieve electrical connection of the pixel electrode pattern and the drain electrode pattern;

the common electrode pattern divided into a plurality of parts, or the common electrode pattern is integrated.

2. The method according to claim 1, wherein the doping treatment is $H_2$, Ar or $NH_3$ plasma treatment.

3. An array substrate, wherein it comprises a substrate;

a data line layer and a light shield layer, disposed on a same layer, formed on the substrate separately, material of the light shield layer and material of the data line layer are metallic material;

a first insulating layer, covering the substrate, the data line layer and the light shield layer;

a source electrode layer, a drain electrode layer, an oxide semiconductor layer and a common electrode layer, formed on the first insulating layer separately, wherein the source electrode layer and the drain electrode layer are adjacent to two sides of the oxide semiconductor layer respectively, the common electrode layer and the drain electrode layer are disposed separately, the source electrode layer, the drain electrode layer and the common electrode layer are formed by processing oxide semiconductor material by doping treatment, the oxide semiconductor layer is capable of preventing influence of light completely subjected to shelter of the light shield layer;

a second insulating layer, covering the oxide semiconductor layer;

a gate electrode layer, formed on the second insulating layer, material of the gate electrode layer is metallic material;

an insulated interlayer deposition, covering the first insulating layer, the source electrode layer, the gate electrode layer, the drain electrode layer and the common electrode layer, the interlayer deposition formed with a first contact hole, a second contact hole and a third contact hole throughout the interlayer deposition respectively, one end of the first contact hole extending to and penetrating the first insulating layer to connect with the data line layer, one end of the second contact hole and the source electrode layer connected, one end of the third contact hole and the drain electrode layer connected, wherein material filled in the first contact hole, the second contact hole and the third contact hole is transparent electrode material;

a transparent electrode layer and a pixel electrode layer, formed on the interlayer deposition separately, material thereof is transparent electrode material, wherein the transparent electrode layer is connected with the other end of the first contact hole and the other end of the second contact hole respectively, so that the source electrode layer is connected with the data line layer through the second contact hole, the transparent electrode layer and the first contact hole electrically, the pixel electrode layer and the other end of the third contact hole are connected to achieve electrical connection of the pixel electrode layer and the drain electrode layer.

4. The array substrate according to claim 3, wherein the common electrode layer is divided into a plurality of parts.

5. The array substrate according to claim 3, wherein the common electrode layer is integrated.

6. The array substrate according to claim 3, wherein the doping treatment is $H_2$, Ar or $NH_3$ plasma treatment.

7. A liquid crystal display panel, wherein it comprises:
a first substrate,
a second substrate, disposed opposite to the first substrate, comprising:
a substrate;
a data line layer and a light shield layer, disposed on a same layer, formed on the substrate separately, material of the light shield layer and material of the data line layer are metallic material;
a first insulating layer, covering the substrate, the data line layer and the light shield layer;
a source electrode layer, a drain electrode layer, an oxide semiconductor layer and a common electrode layer, formed on the first insulating layer separately, wherein the source electrode layer and the drain electrode layer are adjacent to two sides of the oxide semiconductor layer respectively, the common electrode layer and the drain electrode layer are disposed separately, the source electrode layer, the drain electrode layer and the common electrode layer are formed by processing oxide semiconductor material by doping treatment, the oxide semiconductor layer is capable of preventing influence of light completely subjected to shelter of the light shield layer;

a second insulating layer, covering the oxide semiconductor layer;

a gate electrode layer, formed on the second insulating layer, material of the gate electrode layer is metallic material;

an insulated interlayer deposition, covering the first insulating layer, the source electrode layer, the gate electrode layer, the drain electrode layer and the common electrode layer, the interlayer deposition formed with a first contact hole, a second contact hole and a third contact hole throughout the interlayer deposition respectively, one end of the first contact hole extending to and penetrating the first insulating layer to connect with the data line layer, one end of the second contact hole and the source electrode layer connected, one end of the third contact hole and the drain electrode layer connected, wherein material filled in the first contact hole, the second contact hole and the third contact hole is transparent electrode material;

a transparent electrode layer and a pixel electrode layer, formed on the interlayer deposition separately, material thereof is transparent electrode material, wherein the transparent electrode layer is connected with the other end of the first contact hole and the other end of the second contact hole, so that the source electrode layer is connected with the data line layer electrically through the second contact hole, the transparent electrode layer and the first contact hole, the pixel electrode layer and the other end of the third contact hole are connected to achieve electrical connection of the pixel electrode layer and the drain electrode layer;

a liquid crystal layer, disposed between the first substrate and the second substrate.

8. The liquid crystal display panel according to claim 7, wherein the common electrode layer is divided into a plurality of parts.

9. The liquid crystal display panel according to claim 7, wherein the common electrode layer is integrated.

10. The liquid crystal display panel according to claim 7, wherein the doping treatment is $H_2$, Ar or $NH_3$ plasma treatment.

* * * * *